US011277096B2

(12) United States Patent
Midha et al.

(10) Patent No.: US 11,277,096 B2
(45) Date of Patent: Mar. 15, 2022

(54) DIGITALLY CONTROLLED LC OSCILLATOR

(71) Applicant: STMicroelectronics International N.V., Geneva (CH)

(72) Inventors: Gagan Midha, Panipat (IN); Anurup Mitra, Calcutta (IN); Kallol Chatterjee, Kolkata (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/175,732

(22) Filed: Feb. 15, 2021

(65) Prior Publication Data

US 2021/0265947 A1    Aug. 26, 2021

Related U.S. Application Data

(60) Provisional application No. 62/981,094, filed on Feb. 25, 2020.

(51) Int. Cl.
*H03B 5/12* (2006.01)
*H03H 7/06* (2006.01)

(52) U.S. Cl.
CPC ............ *H03B 5/1212* (2013.01); *H03H 7/06* (2013.01); *H03B 2200/004* (2013.01)

(58) Field of Classification Search
CPC ................................................... H03B 5/1212
USPC ....................................................... 331/117 R
See application file for complete search history.

(56) References Cited

U.S. PATENT DOCUMENTS

| 6,658,748 B1* | 12/2003 | Leipold ................ H03K 3/354 327/156 |
| 7,511,589 B2* | 3/2009 | Tarng .................... H03H 9/173 331/117 R |
| 2009/0085681 A1 | 4/2009 | Lin et al. |
| 2010/0013532 A1 | 1/2010 | Ainspan et al. |

(Continued)

FOREIGN PATENT DOCUMENTS

CN    109818611 A    5/2019

OTHER PUBLICATIONS

Mokhtabad, et al., Improving the implementation of ADPLL using LC Voltage Controlled Oscillator, International Academic Journal of Science and Engineering, vol. 3, No. 2, 2016, pp. 68-75.

(Continued)

*Primary Examiner* — Joseph Chang
(74) *Attorney, Agent, or Firm* — Crowe & Dunlevy

(57) ABSTRACT

Disclosed herein is a fine capacitance tuning circuit for a digitally controlled oscillator. The tuning circuit has low and high frequency tuning banks formed by varactors that have their top plates connected to one another. A controller initially sets states of switches selectively connecting the bottom plates of the varactors of the low frequency bank to a low voltage, a high voltage, or to an RC filter, in response to an integer portion of a control word. A sigma-delta modulator initially sets the states of switches selectively connecting the bottom plates of the varactors of the high frequency bank to either the low voltage or the high voltage, in response to a fractional portion of the control word. The controller modifies the states of the switches of the tuning banks in a complementary fashion, based upon comparisons between the fractional portion of the control word and a series of thresholds.

26 Claims, 7 Drawing Sheets

(56) References Cited

U.S. PATENT DOCUMENTS

| | | | |
|---|---|---|---|
| 2011/0221539 A1* | 9/2011 | Mayer | H03B 5/1212 331/36 C |
| 2012/0119839 A1 | 5/2012 | Takahashi et al. | |
| 2016/0056762 A1* | 2/2016 | Ximenes | H03M 1/002 331/117 FE |
| 2017/0302284 A1* | 10/2017 | Petrov | H03L 7/091 |
| 2018/0351528 A1* | 12/2018 | Liu | H03B 5/1234 |
| 2020/0083893 A1* | 3/2020 | Konradsson | H03B 5/1293 |

OTHER PUBLICATIONS

Yan, Na, et al.: "A Low Power All-Digital PLL With -40dBC In-Band Fractional Spur Suppression for NB-IoT Applications," IEEE Access, vol. 7, 2019, pp. 7897-7904.

Ru, Z., et al.: "A 12GHz 210fs 6mW Digital PLL with Sub-Sampling Binary Phase Detector and Voltage-Time Modulated DCO," IEEE, 2013, 2 pages.

* cited by examiner

DIGITALLY CONTROLLED LC OSCILLATOR

RELATED APPLICATION

This application claims priority to U.S. Provisional Application for Patent No. 62/981,094, filed Feb. 25, 2020, the contents of which are incorporated by reference in their entirety.

TECHNICAL FIELD

This disclosure is related to the field of digitally controlled LC oscillators, and in particular, to a digitally controlled LC oscillator utilizing capacitor banks for coarse tuning and varactor banks for fine tuning.

BACKGROUND

A known digital phase locked loop 10 is illustrated in FIG. 1. The digital phase locked loop 10 includes a time-to-digital converter 12 (TDC) which compares the phase of an input reference signal Fref to the phase of a feedback signal Fdiv generated by a loop divider 18 and generates a digital word DW that digitally represents the difference in phase between Fref and Fdiv. A loop filter 14 filters the digital word DW to produce a control word CW that is input to a digitally controlled oscillator (DCO) 16. The DCO 16 generates an oscillating output signal Fdco having a frequency set by the control word CW. A loop divider 18 divides the output signal Fdco by a divisor value to produce the feedback signal Fdiv.

The control word CW causes the DCO 16 to adjust the phase and frequency of the output signal Fdco so that the feedback signal Fdiv is locked to the input reference signal Fref in frequency and phase. The feedback signal Fdiv being locked to the input reference signal Fref in phase implies that the output signal Fdco is locked to the input reference signal Fref in phase. The feedback signal Fdiv being locked to the input reference signal Fref in frequency also implies that the frequency of the output signal Fdco is equal to the frequency of the input reference signal Ffref multiplied by the current divisor value employed by the loop divider 18.

Digital phase locked loops such as this are used in a variety of communications applications, such as in Gaussian frequency shift keying (GFSK) as used in Bluetooth radios present in smartphones, smartwatches, tablets, wearables, and accessories (e.g., wireless headphones and earbuds). GFSK requires the use of a high resolution digitally controlled oscillator, with a modulation depth of 250 KHz peak over a 2.4 GHz carrier. This resolution should be low enough that the quantization error phase noise contribution at the output of the digital phase locked loop is below the thermal and flicker noise contribution of the DCO.

In particular, for Bluetooth the carrier frequency is 2.4 GHz and a digitally controlled oscillator resolution of less than 2.4 KHz is desired. For a typical digitally controlled oscillator utilizing a LC tank for signal generation, this would mean that the capacitance used to tune to the least significant bit of the input control word would be on the order of 4.4 attofarads.

Known designs have not adequately addressed this requirement. As such, additional development is needed.

SUMMARY

Disclosed herein is a digitally controlled oscillator (DCO) including an LC tank circuit. The LC tank circuit has at least one fine tuning circuit. The at least one fine tuning circuit includes: an RC filter; a low frequency tuning bank coupled to a common node, the low frequency tuning bank comprised of a first plurality of varactors each having switches respectively associated therewith; a controller receiving a digital control word as input, the digital control word being comprised of an integer portion and a fractional portion; wherein the controller initially controls the switches of the low frequency tuning bank to thereby turn on one or more initial ones of the first plurality of varactors based upon a voltage represented by the integer portion of the digital control word; a high frequency tuning bank coupled to the common node, the high frequency tuning bank comprised of a second plurality of varactors each having switches respectively associated therewith; and a sigma delta modulator receiving the fractional portion of the digital control word as input and controlling the switches of the high frequency tuning bank based upon a voltage represented by the fractional portion of the digital control word to thereby turn on one or more initial ones of the second plurality of varactors. The controller subsequently controls the switches of the low frequency tuning bank by: comparing the fractional portion of the digital control word to a first threshold voltage, a second threshold voltage less than the first threshold voltage, a third threshold voltage less than the second threshold voltage, and a fourth threshold voltage less than the third threshold voltage; if the fractional portion of the digital control word is greater than the second threshold voltage but less than the first threshold voltage, causing the switches of the low frequency tuning bank to couple a next one of the first plurality of varactors to the RC filter; if the fractional portion of the digital control word is greater than the first threshold voltage, causing the switches of the low frequency tuning bank to turn on the next one of the first plurality of varactors and subtract an offset from the fractional portion; if the fractional portion of the digital control word is greater than the fourth threshold voltage but less than the third threshold voltage, causing the switches of the low frequency tuning bank to couple a previous one of the first plurality of varactors to the RC filter, the previous one of the first plurality of varactors being one of the first plurality of varactors that is currently turned on; and if the fractional portion of the digital control word is less than the fourth threshold voltage, causing the switches of the low frequency tuning bank to turn off the previous one of the first plurality of varactors and add the offset to the fractional portion.

First nodes of the first and second pluralities of varactors may be coupled to the common node, the common node being coupled to a supply voltage.

The switches of the high frequency tuning bank may selectively couple second nodes of the first plurality of varactors to a high voltage, a low voltage, or to the RC filter.

The switches of the low frequency bank selectively may couple second nodes of the second plurality of varactors, through respective RC circuits, to a high voltage or a low voltage.

The subtraction of the offset from the fractional portion may result in the sigma delta modulator causing the switches of the high frequency tuning bank to turn off one of the second plurality of varactors that was initially turned on.

The addition of the offset from the fractional portion may result in the sigma delta modulator causing the switches of the high frequency tuning bank to turn on a next one of the second plurality of varactors.

The offset may be an integer value of 1.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
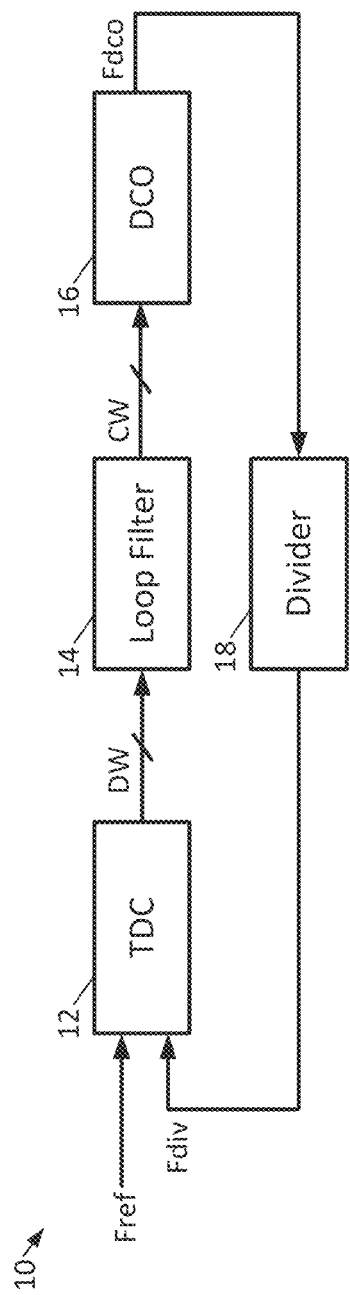
FIG. 1 is a block diagram of a prior art digital phase locked loop utilizing a digitally controlled oscillator.
Figure 2:
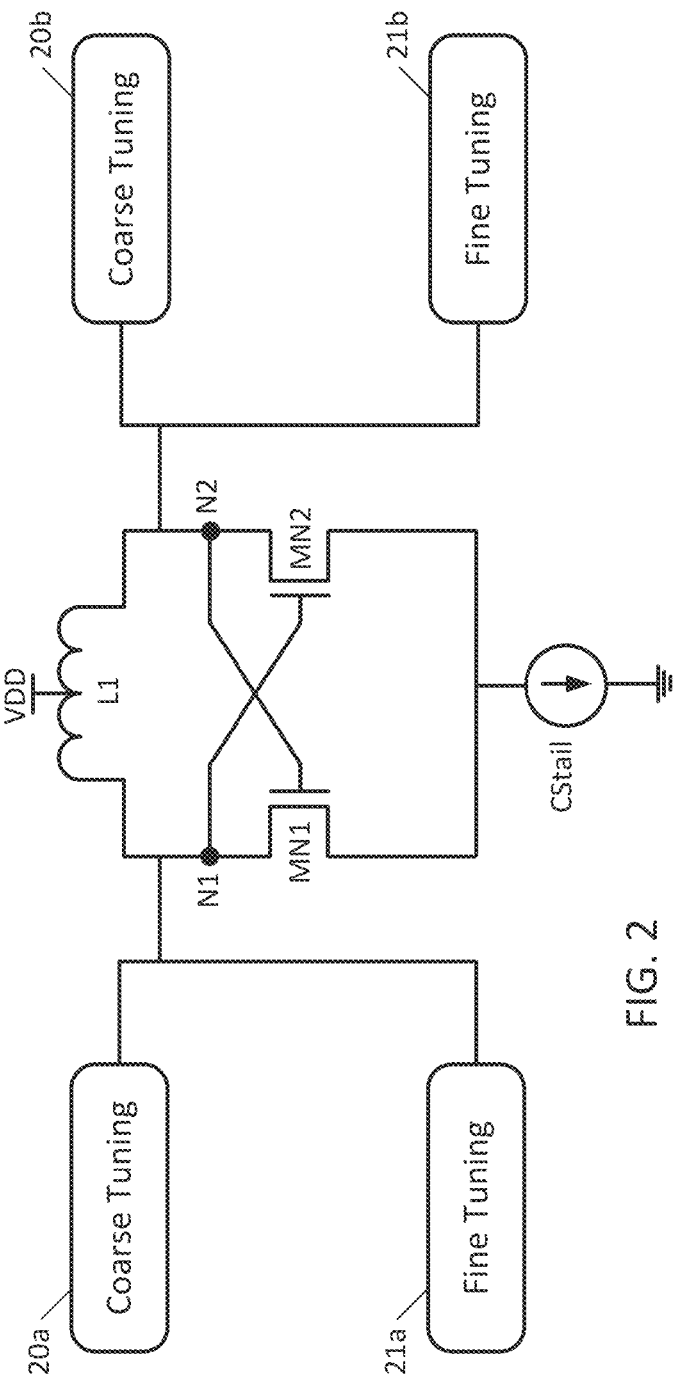
FIG. 2 is a block diagram of a digitally controlled oscillator circuit disclosed herein, such as may be used with the digital phase locked loop of FIG. 1.

With reference to FIG. 2, a digitally controlled oscillator (DCO) 16', such as may be used in the PLL 10 of FIG. 1 in place of the prior art DCO 16, is now described. First, the structure of the DCO 16' will be described, and thereafter the operation of the DCO 16' will be described.

A. Structure of the DCO

The DCO 16' is arranged as an LC tank circuit, comprised of: a first n-channel transistor MN1 having a drain connected to a node N1, a source connected to a tail current source CStail, and a gate connected to a node N2; and a second n-channel transistor MN2 having a drain connected to node N2, a source connected to the tail current source CStail, and a gate connected to node N1. An inductor L1 is connected between nodes N1 and N2, and a center tap of the inductor L1 is connected to a supply voltage VDD. A first coarse tuning circuit 20a is connected to node N1, as is a first fine tuning circuit 21a. A second coarse tuning circuit 20b is connected to node N2, as is a second fine tuning circuit 21b.

Figure 3:
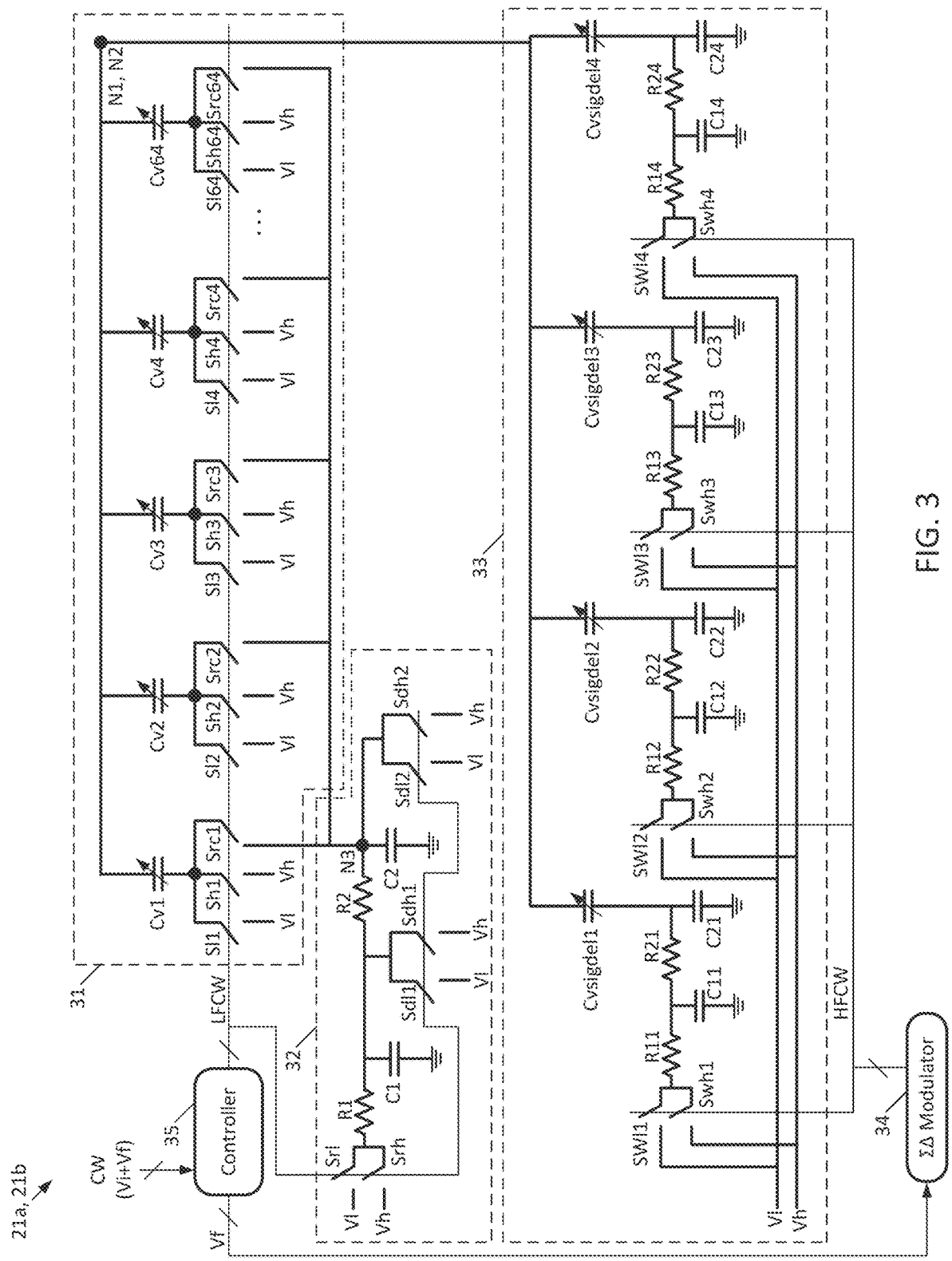
FIG. 3 is a schematic diagram of the fine tuning banks of FIG. 2.

Referring now to FIG. 3, the fine tuning circuit 21a (or 21b; it being understood that the circuit shown in FIG. 3 is present at both instances of the fine tuning circuits 21a and 21b in FIG. 2) is now described. The fine tuning circuit 21a is comprised of a low frequency tuning bank 31, which has a single RC filter 32 connected thereto at node N3, and a high frequency tuning bank 33 which utilizes a double range sigma delta modulator 34 to enhance resolution.

A controller 35 receives a binary control word CW (or control words, it being understood that there may be two control words) output by the loop filter 14 of the PLL. The binary control word CW includes an integer part Vi comprised of 7 bits representing the integer portion and a fractional portion Vf. Vf is comprised of 10 bits representing a fractional part of the voltage and 2 bits representing an overflow integer that is to be added to the integer part Vi; therefore the fractional part Vf is comprised of a total of 12 bits.

As will be explained below, the integer part Vi of the binary control word CW is used by the controller 35 to generate a low frequency control word LFCW for controlling actuation of the switches of the low frequency bank 31, and the fractional part Vf of the binary control word CW is selectively modified by the controller 35 and fed to the sigma delta modulator 34. The sigma delta modulator 34 receives the fractional part Vf from the controller 35, and generates a high frequency control word HFCW for controlling actuation of the switches of the high frequency bank 33. The sigma-delta modulator 34 may be of any order (e.g., second order) and may have any suitable high sampling frequency (e.g., 240 MHz).

The low frequency tuning bank 31 and/or controller 35 may operate at a lower frequency (e.g., 24 MHz). The low frequency tuning bank 31 includes 64 varactors Cv1-Cv64 each having their first nodes connected to node N1 or N2 and their second nodes connected to a switch tree. For example, the second node of varactor Cv1 is connected to switch Sl1 (which selectively connects the second node of varactor Cv1 to the low voltage Vl under control of the low frequency control word LFCW output by the controller 35), switch Sh1 (which selectively connects the second node of varactor Cv1 to the high voltage Vh under control of the low frequency control word LFCW output by the controller 35), and switch Src1 (which selectively connects the second node of varactor Cv1 to the RC filter 32 at node N3 under control of the low frequency control word LFCW output by the controller 35); the second node of varactor Cv2 is connected to switch Sl2 (which selectively connects the second node of varactor Cv3 to the low voltage Vl under control of the low frequency control word LFCW output by the controller 35), switch Sh2 (which selectively connects the second node of varactor Cv2 to the high voltage Vh under control of the low frequency control word LFCW output by the controller 35), and switch Src2 (which selectively connects the second node of varactor Cv2 to the RC filter 32 at node N3 under control of the low frequency control word LFCW output by the controller 35); and so on until the second node of varactor Cv64 is connected to switch Sl64 (which selectively connects the second node of varactor Cv64 to the low voltage Vl under control of the low frequency control word LFCW output by the controller 35), switch Sh64 (which selectively connects the second node of varactor Cv64 to the high voltage Vh under control of the low frequency control word LFCW output by the controller 35), and switch Src64 (which selectively connects the second node of varactor Cv64 to the RC filter 32 at node N3 under control of the low frequency control word LFCW output by the controller 35).

The RC filter 32 includes a resistor R1 selectively connected to the low voltage Vl via switch Srl and selectively connected to the high voltage Vh via switch Srh, under control of the low frequency control word LFCW output by the controller 35. The RC filter 32 also includes a resistor R2 connected in series between the resistor R1 and node N3. A capacitor C1 is connected between the common nodes of resistors R1 and R2 and ground, and a capacitor is connected between node N3 and ground. A switch Sdl1 selectively connects the common nodes of resistors R1 and R2 to the low voltage Vl under control of the low frequency control word LFCW output by the controller 35, and a switch Sdh1 selectively connects the common nodes of resistors R1 and R2 to the high voltage Vh under control of the low frequency control word LFCW output by the controller 35. The node N3 is selectively connected to the low voltage Vl via switch Sdl2, and is selectively connected to the high voltage Vh via switch Sdh2.

The high frequency tuning bank 33 includes varactors Cvsigdel1-Cvsigdel4 each having their first nodes connected to node N1 or N2. A resistor R11 is selectively connected to the low voltage Vl via switch Swl1 and is selectively connected to the high voltage Vh via switch Swh1, under control of the high frequency control word HFCW output by the sigma delta modulator 34. A resistor R21 is connected in series between the resistor R11 and a second node of the varactor Cvsigdel1. A capacitor C11 is connected between the common nodes of resistors R11 and R21 and ground, while a capacitor C21 is connected between the second node of the varactor Cvsigdel1 and ground.

A resistor R12 is selectively connected to the low voltage Vl via switch Swl2 and is selectively connected to the high voltage Vh via switch Swh2, under control of the high frequency control word HFCW output by the sigma delta modulator 34. A resistor R22 is connected in series between the resistor R12 and a second node of the varactor Cvsigdel2. A capacitor C12 is connected between the common nodes of resistors R12 and R22 and ground, while a capacitor C22 is connected between the second node of the varactor Cvsigdel2 and ground.

A resistor R13 is selectively connected to the low voltage Vl via switch Swl3 and is selectively connected to the high voltage Vh via switch Swh3, under control of the high frequency control word HFCW output by the sigma delta modulator 34. A resistor R23 is connected in series between the resistor R13 and a second node of the varactor Cvsigdel3. A capacitor C13 is connected between the common nodes of resistors R13 and R23 and ground, while a capacitor C23 is connected between the second node of the varactor Cvsigdel3 and ground.

A resistor R14 is selectively connected to the low voltage Vl via switch Swl4 and is selectively connected to the high voltage Vh via switch Swh4, under control of the high frequency control word HFCW output by the sigma delta modulator 34 A resistor R24 is connected in series between the resistor R14 and a second node of the varactor Cvsigdel4. A capacitor C14 is connected between the common nodes of resistors R14 and R24 and ground, while a capacitor C24 is connected between the second node of the varactor Cvsigdel4 and ground.

The resistors R1, R11, R12, R13, and R14 may each have the same resistance. In addition, the resistors R2, R21, R22, R23, and R24 may each have the same resistance (that may be different than the resistance of resistors R1, R11, R12, R13, and R14).

The capacitors C11, C12, C13, and C14 may each have a same capacitance. In addition, the capacitors C21, C22, C23, and C24 may each have a same capacitance (that may be different than the capacitance of capacitors C11, C12, C13, and C14).

Figure 4:
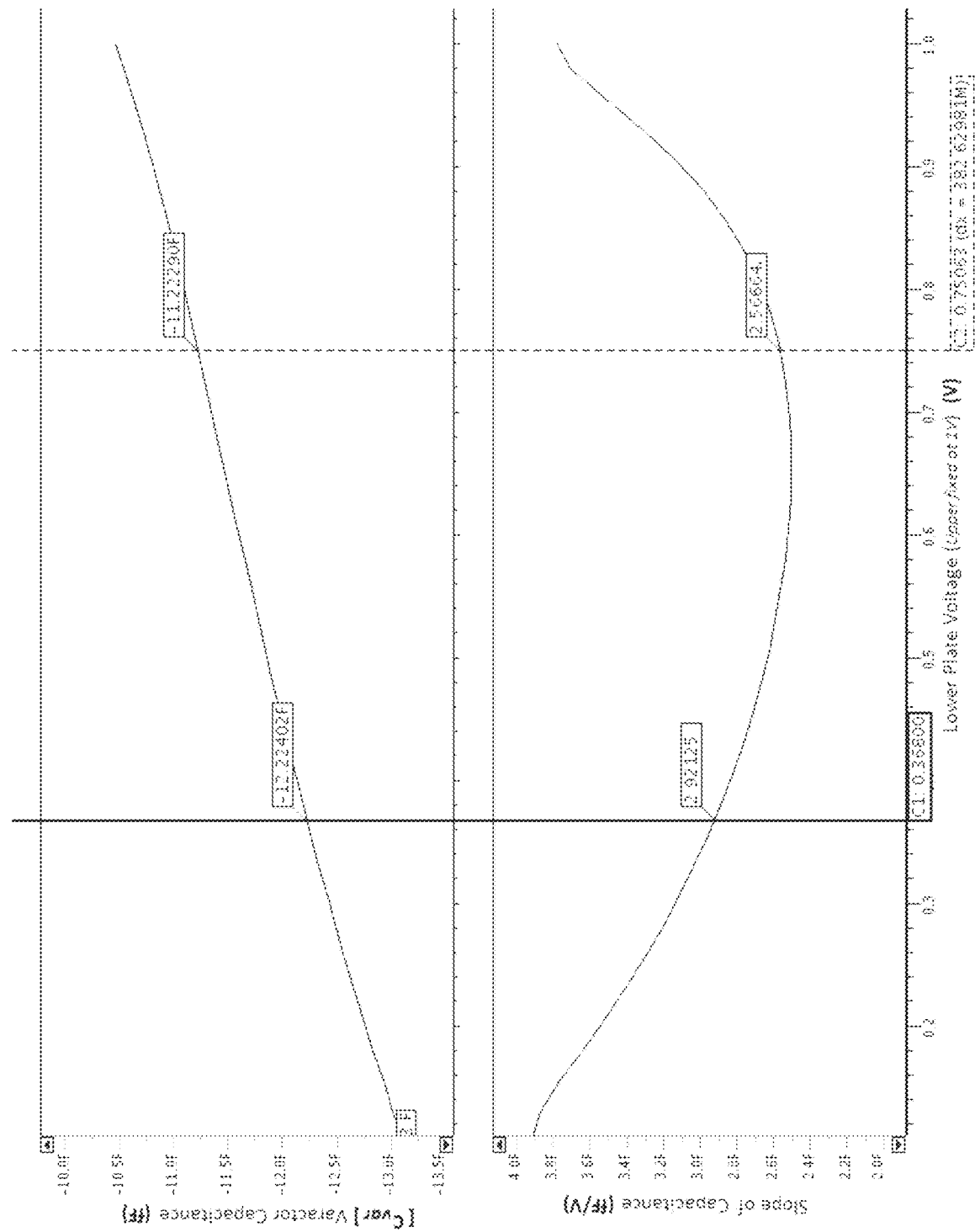
FIG. 4 is a graph illustrating the capacitance of the varactors of FIG. 2 over a range of applied voltages.

The performance of the varactors Cv1-Cv64 and Cvsigdel1-Cvsigdel4 is shown in the graph of FIG. 4, where it can be seen that when the high voltage Vh (which may be 0.75V) is applied to the second node (bottom plate) of these varactors, their capacitance is about 11.22290 femto Farads, and when the low voltage Vl (which may be 0.35V) is applied to the second node of these varactors, their capacitance is about 12.22402 femto Farads.

It should be understood that the number of bits of Vi and Vf may change, and that the examples given above are merely for purposes of illustrating a single example. It should also be understood that the numbers of varactors (and therefore the number of associated switches) of the high frequency and low frequency tuning banks may change, and that the examples given above are merely for purposes of illustrating a single example.

The structure of the coarse tuning circuits 20a, 20b is not shown, but should be understood that each coarse tuning circuit 20a, 20b is an adjustable capacitance formed by any suitable structure (e.g., a plurality of parallel connected capacitors, with each capacitor being selectively switched in or out by a switch).

B. Operation of the DCO

In the examples given below: "Sli" refers to the appropriate switch from among Sl1-Sl64 that is connected to the corresponding varactor from among Cv1-Cv64 that is referred to; "Shi" refers to the appropriate switch from among Sh1-Sh64 that is connected to the corresponding varactor from among Cv1-Cv64 that is referred to; "Srci" refers to the appropriate switch from among Src1-Src64 that is connected to the corresponding varactor from among Cv1-Cv64 that is referred to; "SWli" refers to the appropriate switch from among Swl1-Swl4 that is coupled to the corresponding varactor from among Cvsigdel1-Cvsigdel4 that is referred to; and "SWhi" refers to the appropriate switch from among Swh1-Swh4 that is coupled to the corresponding varactor from among Cvsigdel1-Cvsigdel4 that is referred to.

In the examples given below, a given varactor will be described as being "turned on", "switched on", or simply "on", if its bottom plate is connected to the low voltage Vl, and will be described as being "turned off", "switched off", or simply "off" if its bottom plate is connected to the high voltage Vh. This is the case because when the bottom plate of a given varactor is connected to the high voltage Vh, there is little voltage difference between the top plate and the bottom plate on account of the top plate being connected to Vdd through the inductor L1.

In operation, let us assume that the integer part Vi of the control word CW was decoded and used by the controller 35 to generate an initial value of the low frequency control word LFCW, which sets the switches Sl1-Sl64, Sh1-Sh64, and Src1-Src64 such that a selected number of the varactors Cv1-Cv64 equal to Vi are turned on. This means that the switches Shi and Srci of the selected ones of the varactors Cv1-Cv64 are open, while the switches Sli of the selected ones of the varactors Cv1-Cv64 are closed.

Let us also assume that the fractional part Vf of the control word CW was received as input by the sigma delta modulator 34 and used by the sigma delta modulator 34 to generate the high frequency control word HFCW, the bits of which set the switches SWl1-SWl4 and SWh1-SWh4, such that a selected number of the varactors Cvsigdel1-Cvsigdel4 are turned on. This means that the switches SWhi of the selected ones of the varactors Cvsigdel1-Cvsigdel4 are open, while the switches SWli of the selected ones of the varactors Cvsigdel1-Cvsigdel4 closed.

The sigma delta modulator 34 initially generates the high frequency control word HFCW as dependent upon the fractional part Vf of the control CW. The output of the sigma delta modulator 34 ranges from −1 to 3 in value, with −1 indicating that none of the varactors Cvsigdel1-

Cvsigdel4 are to be switched on, 0 indicating that one of the varactors Cvsigdel1-Cvsigdel4 is to be switched on, 1 indicating that two of the varactors Cvsigdel1-Cvsigdel4 are to be switched on, 2 indicating that three of the varactors Cvsigdel1-Cvsigdel4 are to be switched on, and 4 indicating that all of the varactors Cvsigdel1-Cvsigdel4 are to be switched on. Therefore, as an initial condition, the switches Swhi of the selected ones of the varactors Cvsigdel1-Cvsigdel4 are open, while the switches Swli of the selected ones of the varactors Cvsigdel1-Cvsigdel4 are closed; this means that, conversely, in the initial condition, the switches Swhi of the non-selected ones of the varactors Cvsigdel1-Cvsigdel4 are closed, while the switches Swli of the non-selected ones of the varactors Cvsigdel1-Cvsigdel4 are open.

Figure 6:
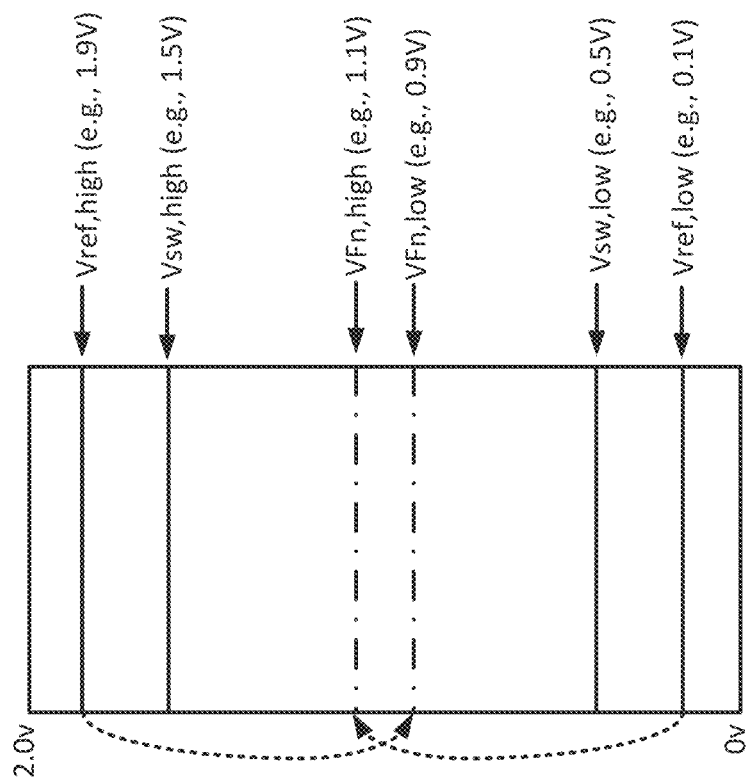
FIG. 6 is a diagram illustrating an input voltage range to the sigma-delta modulator of the fine tuning bank of FIG. 2 with various thresholds indicated.

The controller 35 will apply hysteresis to the sigma delta modulator 34 by comparing the fractional part Vf to a series of thresholds within the range of the voltages represented by Vf (range being between the minimum voltage represented by Vf and the maximum voltage represented by Vf). The range of voltages represented by Vf in this embodiment is from 0V to 2V, and is conveniently illustrated in FIG. 6. The lowest threshold in the series of reference voltages is Vref,low (0.2V in this embodiment). The next highest threshold in the series is Vsw,low (0.5V in this embodiment). The next highest threshold in the series is Vfn,low (0.9V in this embodiment). The next highest threshold in this series is Vfn, high (1.1V in this embodiment). The penultimate threshold in this series is Vsw,high (1.5V in this embodiment), and the highest threshold in this series is Vref,high (1.9V in this embodiment).

If the fractional part Vf is less than Vsw,high but greater than Vsw,low, the controller 35 makes no change to the fractional part Vf; therefore, the connections of Cvsigdel1-Cvsigdel4 remain unchanged.

If the fractional part Vf rises to become greater than Vsw,high, the controller 35 modifies the low frequency control word LFCW so that the RC filter 32 is disconnected from the most recently turned on varactor from among Cv1-Cv64 (provided the RC filter 32 has not yet been disconnected from that varactor) and is connected to the next varactor Cvi from among Cv1-Cv64 to be turned on. The most recently turned on varactor is the varactor from among Cv1-Cv64 that most recently had its bottom plate connected to Vl.

If the fractional part Vf continues to rise and becomes greater than Vref,high, the controller 35 modifies the low frequency control word LFCW so that the bottom plate of the varactor Cvi is connected to the steady state value of Vl, thereby turning on the varactor Cvi. At the same time, the controller 35 subtracts 1 from the value of Vf (which is the input to the sigma delta modulator 34), which has the effect of modifying the high frequency control word HFCS (which is the output from the sigma delta modulator 34) such that the most recently turned on one of the varactors Cvsigdel1-Cvsigdel4 is turned off by coupling its bottom plate to Vh. Here, the most recently turned on varactor is the varactor from among Cvsigdel1-Cvsigdel4 that most recently had its bottom plate coupled to Vh.

Subtracting 1 from the fractional part Vf also serves to return Vf to the condition where it is less than Vsw,high but greater than Vsw,low.

If the fractional part Vf falls to become less than Vsw,low, the controller 35 modifies the low frequency control word LFCW so that the RC filter 32 is connected to the most recently turned on varactor from among Cv1-Cv64 (provided the RC filter 32 was not already connected to that varactor). The most recently turned on varactor is the varactor from among Cv1-Cv64 that most recently had its bottom plate connected to Vl.

If the fractional part Vf continues to fall and becomes less than than Vref,low, the controller 35 modifies the low frequency control word LFCW so that the bottom plate of the varactor Cvi is connected to the steady state value of Vh, thereby turning off the varactor Cvi. At the same time, the controller 35 adds 1 to the value of Vf (which is the input to the sigma delta modulator 34), which has the effect of modifying the high frequency control word HFCW (which is the output from the sigma delta modulator 34) such that a next one of the varactors Cvsigdel1-Cvsigdel4 is turned on by coupling its bottom plate to Vi.

Adding 1 from the fractional part Vf also serves to return Vf to the condition where it is less than Vsw,high but greater than Vsw,low.

The controller 35 and sigma delta modulator 34 continue to operate in this fashion throughout operation, with the operation of the sigma delta modulator 34 occurring at a substantially higher frequency than the operation of the controller 35, for example by a factor of 10 (with the sigma delta modulator 34 operating at 240 MHz and the controller 35 operating at 24 MHz).

Note that when the fractional part Vf rises to become greater than Vsw,high so that the RC filter 32 is to be disconnected from the most recently turned on varactor from among Cv1-Cv64 and is to be connected to the next varactor Cvi from among Cv1-Cv64 to be turned on, there are a series of steps to be performed to perform these operations.

For sake of clarity and ease of understanding, these steps will be described with additional reference to the timing diagram of FIG. 5. In the following example, the time T1 in FIG. 5 will be considered to be the starting condition.

In this starting condition: switch Src2 is closed, and switches Sl1 and Sl2 are closed, thereby turning on varactors Cv1 and Cv2, while switches Sh3-Sh64 are closed, thereby turning off varactors Cv3-Cv64. In addition, the switch Srl is closed. Switches of the low frequency tuning bank 31 not specifically mentioned in this specific example are open.

Continuing with the starting conditions, switches Swl1-Swl2 are closed, thereby turning on varactors Cvsigdel1-Cvsigdel2, while switches Swh3-Swh4 are closed, thereby turning off varactors Cvsigdel3-Cvsigdel3. Switches of the high frequency tuning bank 33 not specifically mentioned in this specific example are open.

Figure 5:
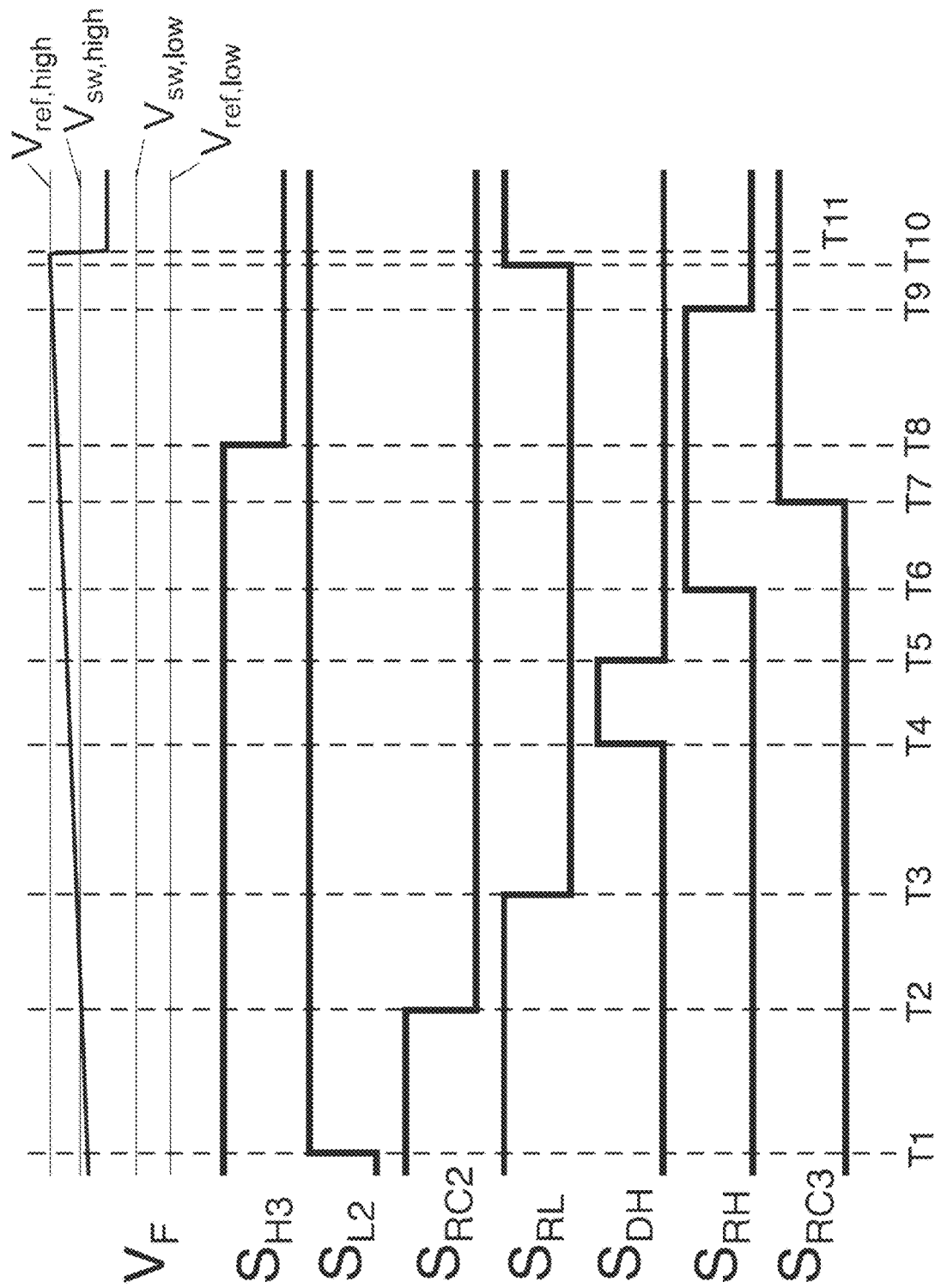
FIG. 5 is a timing diagram of the fine tuning bank of FIG. 2 in operation.

As can be seen in the timing diagram of FIG. 5, in the initial condition (at time T1), the fractional art Vf is less than Vsw,high and greater than Vsw,low; therefore, the controller 35 makes no change to the fractional part Vf.

However, the fractional part Vf continues to rise after time T1. By time T2, the fractional part Vf has risen to be greater than Vsw,high. Therefore, the RC filter 32 needs to be disconnected from the most recently turned on varactor Cv2, and then connected to the next varactor Cv3 to be turned on. To effectuate this:

at time T2, the controller 35 modifies the low frequency control word LFCW so that the switch Src2 is opened, thereby disconnecting the RC filter 32 from the low frequency tuning bank 31;

at time T3, the controller 35 modifies the low frequency control word LFCW so that the switch Srl is opened, disconnecting the RC filter 42 from the low voltage Vl;

at time T4, the controller 35 modifies the low frequency control word LFCW so that the switches Sdh1 and Sdh2 are closed, thereby quickly resetting the capacitors C1 and C2 of the RC filter 32;

at time T5, the controller 35 modifies the low frequency control word LFCW so that the switches Sdh1 and Sdh2 are opened;

at time T6, the controller 35 modifies the low frequency control word LFCW so that the switch Srh is closed, charging the capacitors C1 and C2 to the high voltage Vh;

at time T7, the controller 35 modifies the low frequency control word LFCW so that the switch Src3 is closed, thereby connecting the varactor Cv3 to the high voltage Vh through the RC filter 32, charging the bottom plate of the varactor Cv3 to Vh;

at time T8, the controller 35 modifies the low frequency control word LFCW so that the switch Sh3 is opened, disconnecting the bottom plate of the varactor Cv3 from direct connection to the high voltage Vh;

at time T9, the controller 35 modifies the low frequency control word LFCW so that the switch Srh is opened, disconnecting the RC filter 32 from the high voltage Vh; and at time T10, the controller 35 modifies the low frequency control word LFCW so that the switch Srl is closed, thereby connecting the varactor Cv3 to the low voltage Vl through the RC filter 32, discharging the bottom plate of the varactor Cv3 to Vl.

By time T11, the fractional part Vf has risen to become greater than Vref,high. Therefore, the bottom plate of the varactor Cv3 has settled at the low voltage Vl and is ready to be directly connected to Vl. Although not shown in the timing diagram of FIG. 5, at this point, the switch Sl3 is closed. As explained above, at the same time, the controller 35 subtracts 1 from the value of Vf (which is the input to the sigma delta modulator 34), which ultimately has the effect of modifying the high frequency control word HFCS (which is the output from the sigma delta modulator 34) such that the varactor Cvsigdel2 is turned off by switch Swl2 opening and (shortly thereafter) switch Sh3 closing.

Subtracting 1 from the fractional part Vf also serves to return Vf to the condition where it is less than Vsw,high but greater than Vsw,low.

Naturally, if the fractional part Vf falls to become less than Vsw,low so that the RC filter 32 is to be connected to the most recently turned on varactor from among Cv1-Cv64, in preparation for that varactor to be switched off, there is a series of steps to be performed to perform these operations. These steps are the inverse of the steps described for the case where the fractional part Vf rises to become greater than Vsw,high.

Figure 7:
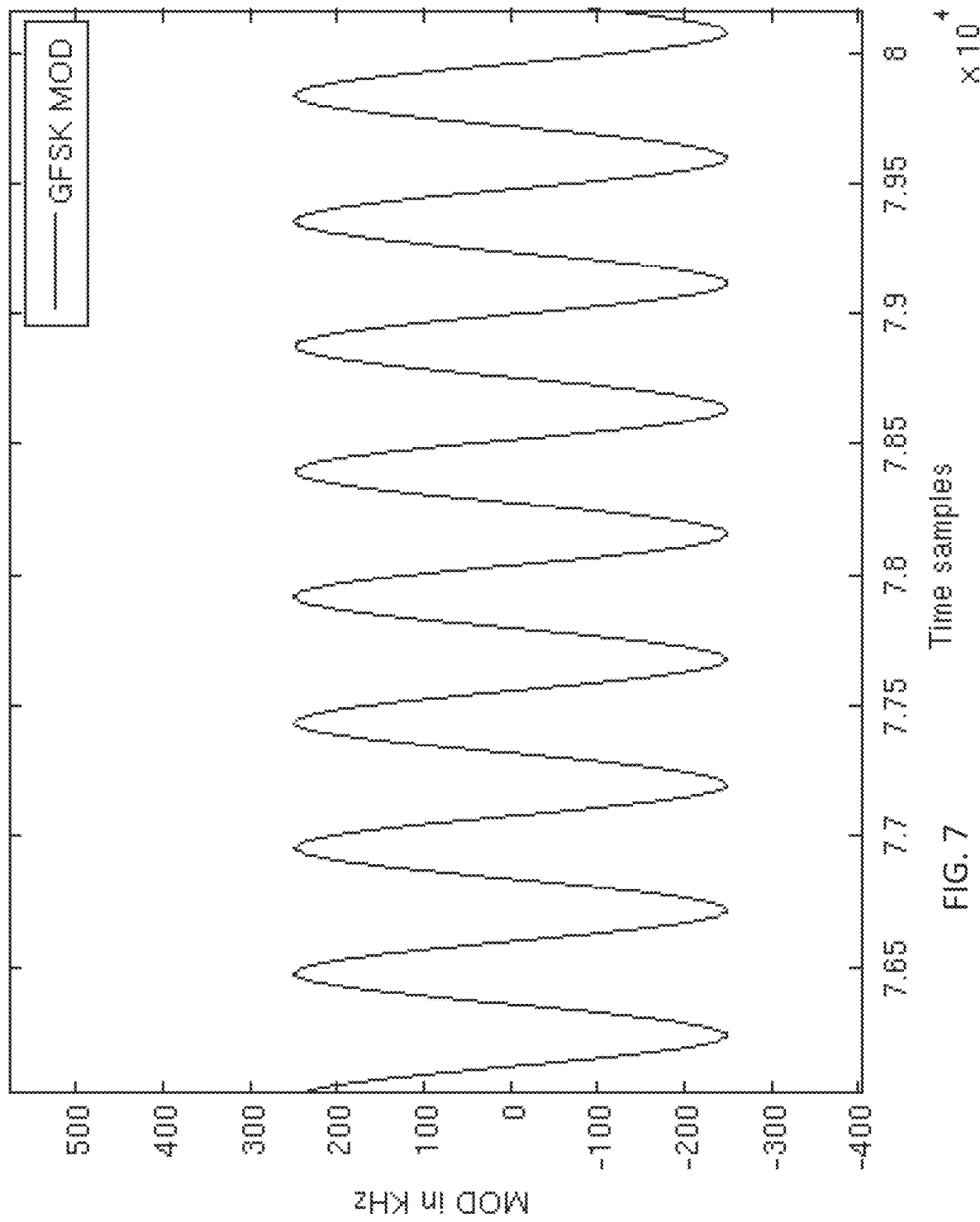
FIG. 7 is a graph illustrating GFSK modulation output generated using the digitally controlled oscillator disclosed herein.
Figure 8:
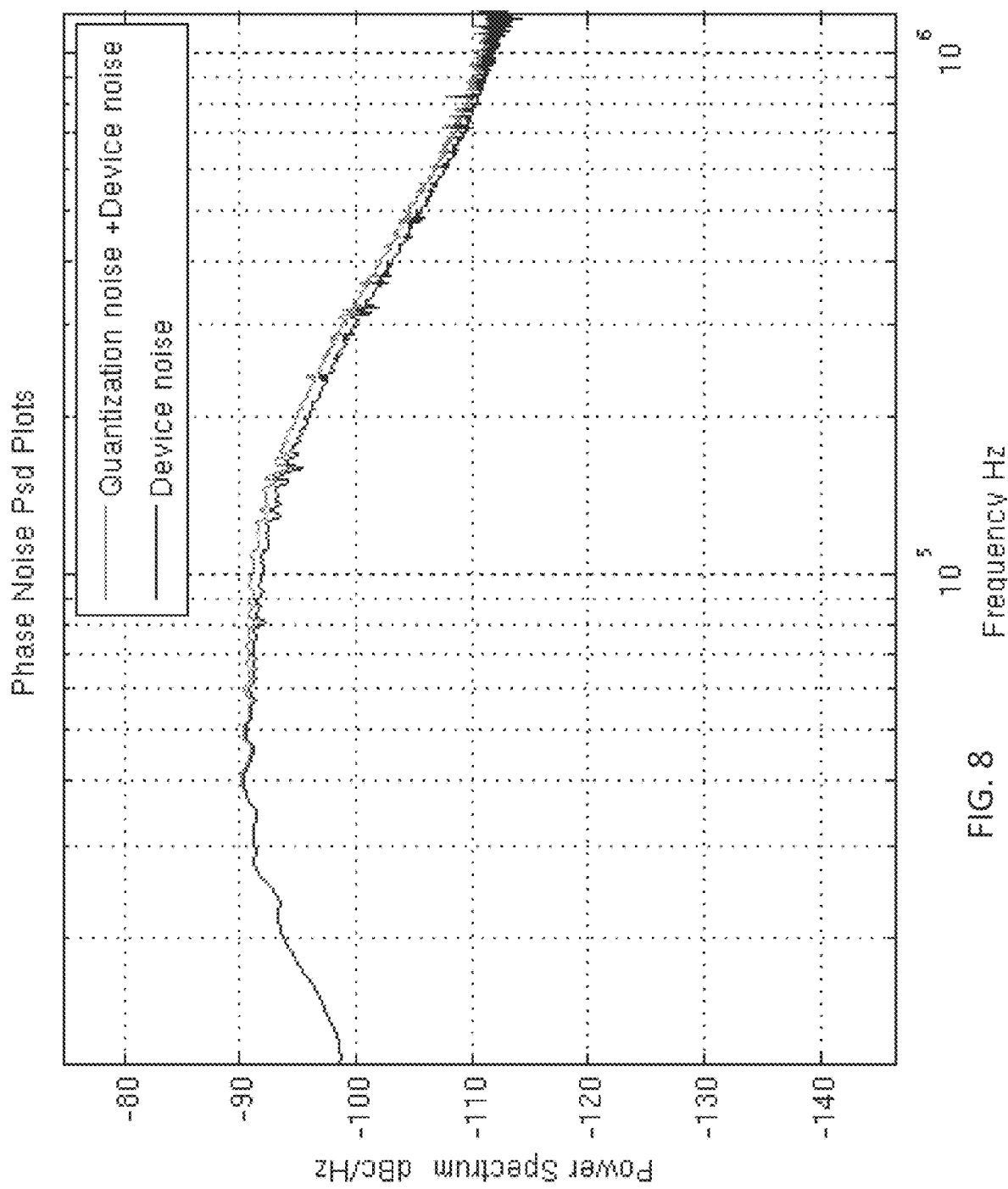
FIG. 8 is a graph illustrating device noise and quantization noise generated by the digitally controlled oscillator disclosed herein.

Sample output GFSK modulation performed using a PLL equipped with a DCO having fine tuning circuits described above is shown in FIG. 7, where the relative absence of noise can be observed. Indeed, it can be seen in FIG. 8 that the quantization noise introduced by using sigma delta modulation is kept low, and is within 1 db of the noise produced by the DCO itself.

With this design, a DCO of any resolution can be produced using sigma delta modulation, while (as shown) adding minimal noise. This occurs due to the separation of the high frequency tuning bank from the low frequency tuning bank, and the combination of the two keeping the numbers of varactors used at high frequency to be low. The use of the double range sigma delta modulator with hysteresis avoids toggling between the high frequency tuning bank and low frequency tuning bank.

Area is conserved due to the use of the single low pass filter on a time sharing basis for both the high frequency tuning bank and the low frequency tuning bank.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A digitally controlled oscillator (DCO), comprising:
an LC tank circuit including:
at least one fine tuning circuit configured to tune capacitance of the LC tank circuit, the at least one fine tuning circuit comprising:
an RC filter;
a low frequency tuning bank comprised of a first plurality of varactors each having switches respectively associated therewith;
a controller receiving a digital control word, the digital control word being comprised of an integer portion and a fractional portion;
a high frequency tuning bank comprised of a second plurality of varactors coupled to the low frequency tuning bank at a common node, each of the second plurality of varactors having switches respectively associated therewith; and
a sigma delta modulator receiving the fractional portion of the digital control word as input and controlling the switches of the high frequency tuning bank based upon a voltage represented by the fractional portion of the digital control word;
wherein the controller is configured to:
if a voltage represented by the fractional portion of the digital control word is greater than a second highest threshold voltage but less than a highest threshold voltage, cause the switches of the low frequency tuning bank to couple the RC filter to one of the first plurality of varactors that is not currently turned on;
if the voltage represented by the fractional portion of the digital control word is greater than the highest threshold voltage, cause the switches of the low frequency tuning bank to turn on the one of the first plurality of varactors that is coupled to the RC filter, and subtract an offset from the fractional portion of the digital control word;
if the voltage represented by the fractional portion of the digital control word is greater than a lowest threshold voltage but less than a second lowest threshold voltage, cause the switches of the low frequency tuning bank to couple one of the first plurality of varactors that is currently turned on to the RC filter; and
if the voltage represented by the fractional portion of the digital control word is less than the lowest threshold voltage, cause the switches of the low frequency tuning bank to turn off the one of the first plurality of varactors that is coupled to the RC filter, and add the offset to the fractional portion of the digital control word.

2. The DCO of claim 1, wherein the subtraction of the offset from the fractional portion of the digital control word results in the sigma delta modulator causing the switches of the high frequency tuning bank to turn off one of the second plurality of varactors that was initially turned on.

3. The DCO of claim 1, wherein the addition of the offset to the fractional portion of the digital control word results in the sigma delta modulator causing the switches of the high frequency tuning bank to turn on a next one of the second plurality of varactors.

4. The DCO of claim 1, wherein the offset is an integer value of 1.

5. The DCO of claim 1, wherein the controller causes the switches of the low frequency tuning bank to couple the RC filter to the one of the first plurality of varactors that is not currently turned on by:
if one of the first plurality of varactors that is currently turned on is coupled to the RC filter, disconnecting that one of the first plurality of varactors from the RC filter;
disconnecting the RC filter from a low voltage;
resetting capacitors of the RC filter by coupling the capacitors to a high voltage;
coupling the RC filter to a high voltage;
coupling the RC filter to the one of the first plurality of varactors that is not currently turned on;
disconnecting the RC filter from the high voltage; and
coupling the RC filter to the low voltage.

6. The DCO of claim 5, wherein the controller causes the switches of the low frequency tuning bank to turn on the one of the first plurality of varactors that is coupled to the RC filter by coupling the one of the first plurality of varactors that is coupled to the RC filter to the low voltage and disconnecting the one of first plurality of varactors that is coupled to the RC filter from the RC filter.

7. A digitally controlled oscillator (DCO), comprising:
an LC tank circuit comprising:
at least one fine tuning circuit comprising:
an RC filter;
a low frequency tuning bank coupled to a common node, the low frequency tuning bank comprised of a first plurality of varactors each having switches respectively associated therewith;
a controller receiving a digital control word as input, the digital control word being comprised of an integer portion and a fractional portion;
wherein the controller initially controls the switches of the low frequency tuning bank to thereby turn on one or more initial ones of the first plurality of varactors based upon a voltage represented by the integer portion of the digital control word;
a high frequency tuning bank coupled to the common node, the high frequency tuning bank comprised of a second plurality of varactors each having switches respectively associated therewith; and
a sigma delta modulator receiving the fractional portion of the digital control word as input and controlling the switches of the high frequency tuning bank based upon a voltage represented by the fractional portion of the digital control word to thereby turn on one or more initial ones of the second plurality of varactors;
wherein the controller subsequently controls the switches of the low frequency tuning bank by:
comparing the voltage represented by the fractional portion of the digital control word to a first threshold voltage, a second threshold voltage less than the first threshold voltage, a third threshold voltage less than the second threshold voltage, and a fourth threshold voltage less than the third threshold voltage;
if the voltage represented by the fractional portion of the digital control word is greater than the second threshold voltage but less than the first threshold voltage, causing the switches of the low frequency tuning bank to couple a next one of the first plurality of varactors to the RC filter;
if the voltage represented by the fractional portion of the digital control word is greater than the first threshold voltage, causing the switches of the low frequency tuning bank to turn on the next one of the first plurality of varactors and subtract an offset from the fractional portion of the digital control word;
if the voltage represented by the fractional portion of the digital control word is greater than the fourth threshold voltage but less than the third threshold voltage, causing the switches of the low frequency tuning bank to couple a previous one of the first plurality of varactors to the RC filter, the previous one of the first plurality of varactors being one of the first plurality of varactors that is currently turned on; and
if the voltage represented by the fractional portion of the digital control word is less than the fourth threshold voltage, causing the switches of the low frequency tuning bank to turn off the previous one of the first plurality of varactors and add the offset to the fractional portion of the digital control word.

8. The DCO of claim 7, wherein first nodes of the first and second pluralities of varactors are coupled to the common node, the common node being coupled to a supply voltage.

9. The DCO of claim 8, wherein the switches of the high frequency tuning bank selectively couple second nodes of the first plurality of varactors to a high voltage, a low voltage, or to the RC filter.

10. The DCO of claim 8, wherein the switches of the low frequency bank selectively couple second nodes of the second plurality of varactors, through respective RC circuits, to a high voltage or a low voltage.

11. The DCO of claim 7, wherein the subtraction of the offset from the fractional portion of the digital control word results in the sigma delta modulator causing the switches of the high frequency tuning bank to turn off one of the second plurality of varactors that was initially turned on.

12. The DCO of claim 7, wherein the addition of the offset to the fractional portion of the digital control word results in the sigma delta modulator causing the switches of the high frequency tuning bank to turn on a next one of the second plurality of varactors.

13. The DCO of claim 7, wherein the offset is an integer value of 1.

14. A method of operating a digitally controlled oscillator (DCO) formed by an LC tank circuit comprised of at least one fine tuning circuit for tuning capacitance of the LC tank circuit, the method comprising:
receiving a digital control word, the digital control word being comprised of an integer portion and a fractional portion;
if a voltage represented by the fractional portion of the digital control word is greater than a second highest threshold voltage but less than a highest threshold voltage, causing switches of a low frequency tuning bank of the at least one fine tuning circuit to couple a RC filter to one of a first plurality of varactors that is not currently turned on;
if the voltage represented by the fractional portion of the digital control word is greater than the highest threshold voltage, causing the switches of the low frequency tuning bank to turn on the one of the first plurality of varactors that is coupled to the RC filter, and subtracting an offset from the fractional portion of the digital control word;
if the voltage represented by the fractional portion of the digital control word is greater than a lowest threshold voltage but less than a second lowest threshold voltage, causing the switches of the low frequency tuning bank to couple one of the first plurality of varactors that is currently turned on to the RC filter; and if the voltage represented by the fractional portion of the digital control word is less than the lowest threshold voltage, causing the switches of the low frequency tuning bank to turn off the one of the first plurality of varactors that is coupled to the RC filter, and adding the offset to the fractional portion of the digital control word.

15. The method of claim 14, wherein the subtraction of the offset from the fractional portion of the digital control word results in a sigma delta modulator causing a switches of a high frequency tuning bank of the at least one fine tuning circuit to turn off one of a second plurality of varactors that was initially turned on.

16. The method of claim 15, wherein the addition of the offset to the fractional portion of the digital control word results in a sigma delta modulator causing the switches of the high frequency tuning bank to turn on a next one of the second plurality of varactors.

17. The method of claim 14, wherein the offset is an integer value of 1.

18. The method of claim 14, wherein the switches of the low frequency tuning bank couple the RC filter to the one of the first plurality of varactors that is not currently turned on by:

if one of the first plurality of varactors that is currently turned on is coupled to the RC filter, disconnecting that one of the first plurality of varactors from the RC filter;
disconnecting the RC filter from a low voltage;
resetting capacitors of the RC filter by coupling the capacitors to a high voltage;
coupling the RC filter to a high voltage;
coupling the RC filter to the one of the first plurality of varactors that is not currently turned on;
disconnecting the RC filter from the high voltage; and
coupling the RC filter to the low voltage.

19. The method of claim 18, wherein the controller causes the switches of the low frequency tuning bank to turn on the one of the first plurality of varactors that is coupled to the RC filter by coupling the one of the first plurality of varactors that is coupled to the RC filter to the low voltage and disconnecting the one of first plurality of varactors that is coupled to the RC filter from the RC filter.

20. A digitally controlled oscillator (DCO), comprising:
an LC tank circuit including:
at least one fine tuning circuit for tuning capacitance of the LC tank circuit, the at least one fine tuning circuit comprising:
an RC filter;
a low frequency tuning bank comprised of a first plurality of varactors each having switches respectively associated therewith;
a controller receiving a digital control word, the digital control word being comprised of an integer portion and a fractional portion;
a high frequency tuning bank comprised of a second plurality of varactors coupled to the low frequency tuning bank at a common node, each of the second plurality of varactors having switches respectively associated therewith; and
a sigma delta modulator receiving the fractional portion of the digital control word as input and controlling the switches of the high frequency tuning bank based upon a voltage represented by the fractional portion of the digital control word.

21. The DCO of claim 20, wherein a controller causes the switches of the low frequency tuning bank to couple the RC filter to the one of the first plurality of varactors that is not currently turned on by:

if one of the first plurality of varactors that is currently turned is coupled to the RC filter, disconnecting that one of the first plurality of varactors from the RC filter;
disconnecting the RC filter from a low voltage;
resetting capacitors of the RC filter by coupling the capacitors to a high voltage;
coupling the RC filter to a high voltage;
coupling the RC filter to the one of the first plurality of varactors that is not currently turned on;
disconnecting the RC filter from the high voltage; and
coupling the RC filter to the low voltage.

22. The DCO of claim 21, wherein the controller causes the switches of the low frequency tuning bank to turn on the one of the first plurality of varactors that is coupled to the RC filter by coupling the one of the first plurality of varactors that is coupled to the RC filter to the low voltage and disconnecting the one of first plurality of varactors that is coupled to the RC filter from the RC filter.

23. A digitally controlled oscillator (DCO), comprising:
an LC tank circuit comprising:
at least one fine tuning circuit comprising:
an RC filter;
a low frequency tuning bank coupled to a common node, the low frequency tuning bank comprised of a first plurality of varactors each having switches respectively associated therewith;
a controller receiving a digital control word as input, the digital control word being comprised of an integer portion and a fractional portion;
wherein the controller initially controls the switches of the low frequency tuning bank to thereby turn on one or more initial ones of the first plurality of varactors based upon a voltage represented by the integer portion of the digital control word;
a high frequency tuning bank coupled to the common node, the high frequency tuning bank comprised of a second plurality of varactors each having switches respectively associated therewith; and
a sigma delta modulator receiving the fractional portion of the digital control word as input and controlling the switches of the high frequency tuning bank based upon a voltage represented by the fractional portion of the digital control word to thereby turn on one or more initial ones of the second plurality of varactors.

24. The DCO of claim 23, wherein first nodes of the first and second pluralities of varactors are coupled to the common node, the common node being coupled to a supply voltage.

25. The DCO of claim 24, wherein the switches of the high frequency tuning bank selectively couple second nodes of the first plurality of varactors to a high voltage, a low voltage, or to the RC filter.

26. The DCO of claim 24, wherein the switches of the low frequency bank selectively couple second nodes of the second plurality of varactors, through respective RC circuits, to a high voltage or a low voltage.

* * * * *